United States Patent [19]

Littlefield

[11] Patent Number: 4,916,410

[45] Date of Patent: Apr. 10, 1990

[54] HYBRID-BALUN FOR SPLITTING/COMBINING RF POWER

[75] Inventor: E. M. Littlefield, Redington Beach, Fla.

[73] Assignee: E-Systems, Inc., Dallas, Tex.

[21] Appl. No.: 345,225

[22] Filed: May 1, 1989

[51] Int. Cl.[4] .............................. H03F 3/68; H01P 5/10
[52] U.S. Cl. ..................................... 330/295; 330/301; 333/5; 333/127; 333/26
[58] Field of Search ......................... 333/4, 5, 117, 123, 333/127, 136, 25, 26; 330/295, 301

[56] References Cited

U.S. PATENT DOCUMENTS

| | | |
|---|---|---|
| 2,777,115 | 1/1957 | Linvill . |
| 3,181,087 | 4/1965 | Almering . |
| 3,614,676 | 10/1971 | Boelke ................... 333/26 |
| 3,652,952 | 3/1972 | Chen . |
| 4,063,176 | 12/1977 | Milligan et al. ................ 333/26 X |
| 4,309,666 | 1/1982 | Ito et al. . |
| 4,455,536 | 6/1984 | Stegens . |
| 4,485,488 | 11/1984 | Houdart ...................... 333/26 X |
| 4,647,868 | 3/1987 | Mueller . |
| 4,700,152 | 10/1987 | Wilson ............................ 333/5 X |
| 4,721,929 | 1/1988 | Schnetzer ......................... 333/127 |
| 4,803,443 | 2/1989 | Takagi et al. .................. 330/295 X |

FOREIGN PATENT DOCUMENTS 2556508 12/1983 France .
2161940 1/1986 United Kingdom .

OTHER PUBLICATIONS

Phelan, *A Wide-Band Parallel-Connected Balun*, IEEE Trans. on MTT, May 1970, pp. 259-263.

*Primary Examiner*—Paul Gensler
*Attorney, Agent, or Firm*—Harold E. Meier

[57] ABSTRACT

An in-phase hybrid and a balun in a single stage built with inexpensive coaxial cable which splits or combines RF power and simultaneously performs a balanced-to-unbalanced impedance transformation.

15 Claims, 1 Drawing Sheet

4,916,410

HYBRID-BALUN FOR SPLITTING/COMBINING RF POWER

TECHNICAL FIELD

The present invention relates to a balun for performing a balanced-to-unbalanced impedance transformation and simultaneously to split unbalanced input RF power into first and second balanced RF output signals which are isolated from each other to form an in-phase hybrid-balun.

BACKGROUND OF THE INVENTION

It is well known in the art that a typical RF power amplifier requires some type of hybrid to split and combine RF power because there are limits to the output power of a single transistor. A hybrid is a 3dB (equal power division) directional coupler. High-powered, push-pull transistors are used because such circuit allows the terminal impedances of the transistors to be connected in series for RF operation. These high powered transistors have a very low impedance and thus, special requirements must be met in order to match the push-pull transistors to input and output impedances. Thus, two elements are involved in the attempt to increase RF power output. The first element is a hybrid which splits the incoming RF power from a single input to two outputs which are isolated from each other. The difficulty occurs not in splitting the RF signals, but in splitting those signals such that they are isolated from each other which is a requirement for the hybrid. The other requirement is the need for a balun which performs a balanced-to-unbalanced (balun) impedance transformation. This is necessary because the input and output circuitry for balanced-transistor amplifiers must not only match the impedance of the device to that of the system in order to ensure proper efficiency, bandwidth and power transfer, but also must take an unbalanced input, referenced to ground, and create a balanced output comprised of two signals which are precisely 180° out of phase.

The most common hybrid is the in-phase type, also known as the Wilkinson type, such as that disclosed in U.S. Pat. No. 4,309,666. Hybrids differ with respect to bandwidth, loss, phase and amplitude balance, cost and fabrication. Once a hybrid is chosen that suits the application, it must be cascaded with balun impedance transformers to match the input impedance of the push-pull transistors. Thus, the prior art requires a hybrid cascaded with the balun impedance transformers to enable RF power to be split, amplified and then recombined at a higher power level.

SUMMARY OF THE INVENTION

According to the present invention, the hybrid-balun is an in-phase hybrid and a balun combined in a single stage. It is not only simple to build with inexpensive coaxial cable, but it also occupies only one-half the space of the normal cascaded arrangement. By combining the two functions into a single device, losses are held low.

In the preferred embodiment, first and second coaxial cable baluns receive an unbalanced RF input signal and generate first and second balanced RF output signals. Each of the baluns has a signal input port at one end including an inner conductor and a grounded outer conductor for receiving the unbalanced RF signal. Each of the baluns also has an output port at the other end including an inner conductor and an outer conductor for providing a balanced RF signal output. The input ports of the first and second baluns are connected in parallel to split the input unbalanced RF power into first and second balanced, RF output signals. Signal isolation means connect the output ports of the first and second baluns to isolate the output ports from each other and form an in-phase hybrid-balun.

The same circuit can be used to combine first and second balanced RF input signals into a single unbalanced RF output signal. In this case, the first and second coaxial cable baluns receive corresponding first and second balanced RF signal inputs and generate a combined unbalanced RF output signal. Each balun has a signal input port at one end including an inner conductor and an outer conductor for receiving one of the balanced RF input signals and an RF signal output port at the other end having an inner conductor and a grounded outer conductor for providing the unbalanced RF output signal. Signal isolation means connect the input ports of the baluns to isolate the input ports from each other. The output ports of the baluns are connected in parallel to combine the first and second balanced RF input signals into an unbalanced RF output signal so as to form an in-phase hybrid-balun.

By coupling the balanced RF output signals from the balun which splits the power to circuits including push-pull transistors and matching impedance networks, and by coupling the output of the push-pull transistors to the input of the balun used as a power combiner, a hybrid-balun power splitter/combiner is formed in one unit.

If even greater power is required, typical prior art hybrids can be used to split the unbalanced input RF signal into two signal components. By coupling those signal components as an input to two hybrid-balun power splitter/combiners and coupling another hybrid as a combiner to receive the outputs of two hybrid-baluns, a power splitter/combiner is formed that provides unbalanced amplified RF output with substantially greater power.

BRIEF DESCRIPTION OF THE DRAWINGS

A more complete understanding of the invention may be had by reference to the following detailed description when taken in conjunction with the accompanying drawings wherein.

DETAILED DESCRIPTION OF THE DRAWINGS

As is well known in the art, a balun circuit must take an unbalanced RF input, referenced to ground, and create a balanced output comprising two signals which are 180° out of phase with each other. Further, the balun simultaneously provides a balanced-to-unbalanced impedance transformation that matches the input impedance of the balanced system to the output impedance of the unbalanced system.

In addition, baluns function equally well in reverse. That is, they can accept balanced first and second input signals and combine them into an unbalanced output signal with one side grounded. Again, they simultaneously provide an impedance transformation from the input impedance of the unbalanced signal system to the output impedance of the balanced signal system.

Figure 1:
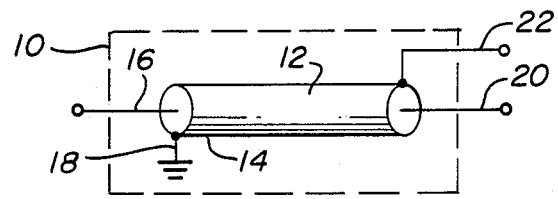
FIG. 1 is a schematic representation of a prior art coaxial cable balun.

There are several different types of baluns including stripline, microstrip, transformer types, and coaxial cable types. A prior art coaxial cable balun 10 is disclosed in FIG. 1 and comprises the coaxial cable 12 that has a center conductor 16 and an outer conductor 14, which may be a metallic sheath which encases the inner conductor 16. Typically, the unbalanced input RF signal is coupled to center conductor 16 and ground 18. Ground 18 is simply coupled to the outer conductor 14 at the input end of the coaxial cable 12. The balanced output signals are generated on conductors 20 and 22. These output signals are balanced and are 180° out of phase with each other, but are not isolated from each other. In the prior art, the balanced signals on lines 20 and 22 may be coupled to push-pull amplifiers to obtain power amplification.

It is also well known in the art that a typical RF power amplifier requires some type of hybrid to split, amplify and recombine the RF power because there are limits to the output power of a single push-pull transistor. Thus, some type of hybrid must accept the incoming unbalanced RF power and split it into two separate balanced channels each of which can be amplified. A second hybrid must then be used to combine the balanced, amplified RF output back to the unbalanced amplified output. This circuit must match the input impedance of the RF push-pull transistors to the impedance of the hybrid circuit producing the output balanced signals. It must also provide amplification of the signals on each channel without affecting the other. Such cannot be done where the output balanced signals are not isolated from each other.

The most common hybrids are the in-phase type and the quadrature type. These hybrids differ with respect to bandwidth, loss, phase and amplitude balance, cost and fabrication. However, once a hybrid is chosen that suits the application, it must be cascaded with balun impedance transformers to match the input of the push-pull transistors or if power is being combined, it must match the output impedance of the push-pull transistors.

Figure 2:
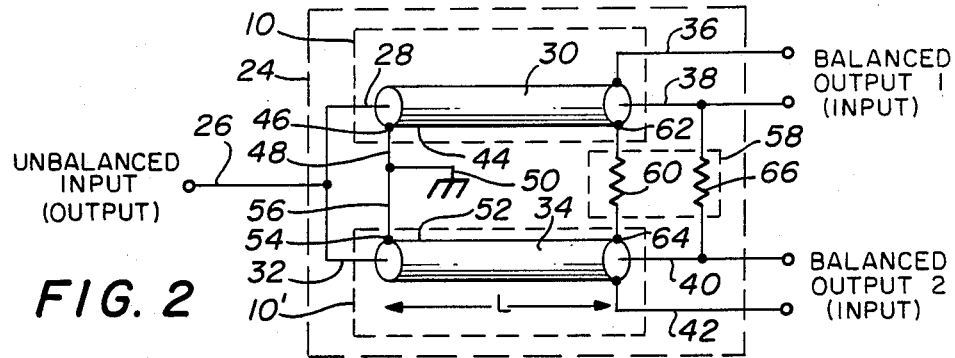
FIG. 2 is a schematic diagram of a hybrid-balun of the present invention utilizing two coaxial baluns that are connected in parallel to an unbalanced input and which generates first and second isolated balanced outputs.

FIG. 2 is a schematic representation of the present invention which is a hybrid-balun having an in-phase hybrid and a balun in a single stage. It may be used to split an unbalanced input signal into two balanced output signals or it may be used in reverse; that is, it may receive two balanced input signals and combine them into an unbalanced output signal. The hybrid-balun can be built using any type of transformer or transmission line circuit, including stripline, microstrip, finline, twisted pair, or coaxial cable circuits. It is simple to build with inexpensive coaxial cable and it occupies approximately one-half the space of the normal cascaded arrangement. Because the hybrid-balun combines two functions into a single stage, losses are held low. The hybrid-balun 24 shown in FIG. 2 includes two of the coaxial cable baluns 10 in FIG. 1 and are designated in FIG. 2 by the numerals 10 and 10'. Thus, each of the baluns 10 and 10' provide the balanced-to-unbalanced impedance transformation as explained earlier. The unbalanced input on line 26 is coupled to the center conductor 28 of coaxial cable 30 and on center conductor 32 of the second coaxial cable 34. Each of the baluns 10 and 10' generate balanced output signals. Balun 10 generates balanced output signals on conductors 36 and 38 while balun 10' generates balanced output signals on conductors 40 and 42. Thus, the incoming unbalanced power has been split into two balanced output signals, the first on lines 36 and 38 and the second on lines 40 and 42. It is necessary that these signals be isolated from each other to form a hybrid.

Outer conductor 44 of coaxial cable 30 is grounded at Point 46 at the input end with a conductor 48 which is coupled to ground 50. In a like manner, outer conductor 52 of coaxial cable 34 is grounded at point 54 on the input end by conductor 56 which is also coupled to ground 50. Thus, the unbalanced input on line 26 is coupled in Parallel as an unbalanced input to coaxial cable 30 on conductors 28 and 48 and to coaxial cable 34 on conductors 32 and 56. Each of the baluns 10 and 10 is formed from coaxial cable segments 30 and 34 respectively. Each segment has a length, L, which is approximately $\lambda/4$ where $\lambda=$ the wave length at the center frequency of the passband. The length, L, could also be greater than or less than $\lambda/4$ to act as an impedance transformer. Each balun, then, will have a predetermined characteristic impedance value. On the output end, an isolation circuit 58 exists which includes a first resistor 60 which couples the outer conductor 44 of coaxial cable 30 at point 62 with the outer conductor 52 of coaxial cable 34 at point 64. A second isolation resistor 66 is coupled between inner conductor 38 of coaxial cable 30 and inner conductor 40 of coaxial cable 34. These isolation resistors 60 and 66 have values sufficient to provide port-to-port isolation of the output ports 36, 38 and 40, 42. In FIG. 2, for example, each balun 30 and 34 may have a characteristic impedance of 71 ohms and each of the isolation resistors may have a value of 50 ohms. The component values used in this example yield a hybrid-balun with a 50 $\Omega$ impedance at each port, which is a one-to-one impedance ratio. Other transformation ratios can be implemented by the proper selection of component values. For high-power applications the isolation resistors should be high power RF resistors as disclosed in commonly assigned U.S. Pat. No. 4,727,351 and which is incorporated herein in its entirety by reference. As disclosed in U.S. Pat. No. 4,727,351, the high power resistance comprises a thermally conductive substrate, a first insulating layer extending over the substrate and having a top surface and a bottom surface, a first metallization layer extending over the top surface of the first insulating layer and having a gap, a second insulating layer above the first insulating layer and having a top surface, a bottom surface and first and second side surfaces, a second metallization layer surrounding the bottom surface and the first and second side surfaces of the second insulating layer and including a gap, the gap in the second metallization layer positioned to be in alignment with the gap in the first metallization layer, a resistive layer extending over the second insulating layer, and means for coupling the resistive layer into an electrical circuit.

Figure 3:
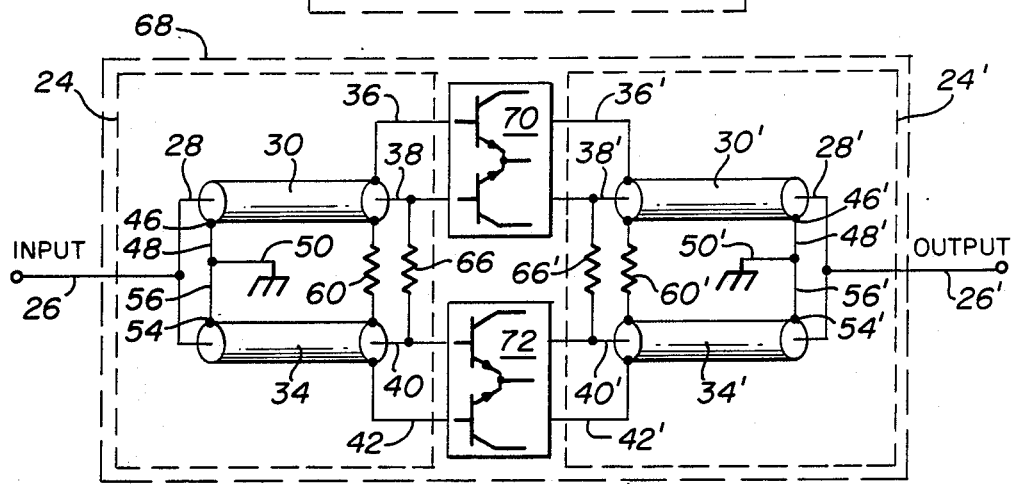
FIG. 3 is a schematic representation of a hybrid-balun, power splitter/combiner which utilizes two of the hybrid-baluns disclosed in FIG. 2 with push-pull power amplifiers inserted between them.

In the configuration shown in FIG. 2, not only do the parallel coaxial cables 30 and 34 form a hybrid generating first and second balanced output signals which are isolated from each other, but they also provide the necessary balun transformation to match a push-pull transistor circuit input impedance with the impedance of the line 26 generating the unbalanced input signal. Thus, the circuit in FIG. 2 is both a hybrid and a balun performing their functions simultaneously in a single stage. In the prior art, the balun and the hybrid have been separate units which are cascaded with each other. Thus, because the present hybrid-balun performs both functions in a single stage, it occupies approximately one-half the space of the normal cascaded arrangement. FIG. 3 illustrates how the hybrid-balun disclosed in FIG. 2 can be utilized in a power splitter/combiner 68. Power splitter/combiner 68 comprises a first hybrid-balun 24 such as that disclosed in FIG. 2 and a second hybrid-balun 24' also similar to that shown in FIG. 2 except that it is reversed with the balanced signals as the input and the unbalanced signal as the output. Identical numbers are used in FIG. 3 for like components in FIG. 2 so that the elements can be compared. Typical push-pull RF amplifiers 70 and 72 amplify the balanced output signals from the first hybrid-balun 24 and couple the amplified signals to the second hybrid-balun 24'. Circuits 70 and 72 are push-pull transistor circuits which include the impedance matching networks on the input and output and are typical of prior art amplifier circuits. In this example, the characteristic impedance of the coaxial cable is 50 Ω and the isolation resistors have a value of 25 Ω. The 50 Ω input impedance at the unbalanced port has been transformed down to 25 Ω at the balanced ports, which is a 2:1 transformation ratio.

Thus, in FIG. 3, the first hybrid-balun 24 splits the incoming unbalanced RF power on line 26 into two balanced, isolated outputs, one on lines 36 and 38 and one on lines 40 and 42. Push-pull transistor circuit 70 is coupled to hybrid-balun 24 to receive the balanced output signals on lines 36 and 38 and amplify the RF signals. The amplified RF signals are output to the second hybrid-balun 24' on lines 36' and 38'. In a like manner, push-pull transistor circuit 72 is coupled to the first hybrid-balun 24 to receive the second balanced output signals on line 40 and 42. These output signals are amplified and coupled to the second hybrid-balun 24' on lines 40' and 42'. Second hybrid-balun 24' functions as indicated previously to combine the balanced, isolated signals into a single unbalanced signal with respect to ground on line 26'.

Thus, in FIG. 3, the power is increased by amplifying each of the balanced output signals from hybrid-balun 24 separately and then combining the amplified signals to obtain the unbalanced, amplified output signal with respect to ground. Thus, not only do the hybrid-baluns allow proper impedance matching between the input line 26, the output line 26' and the push-pull transistors, but it also allows the individual balanced output signals to be amplified to the maximum limit of the push-pull transistors and then recombined at a higher power level as the unbalanced output signal.

Figure 4:
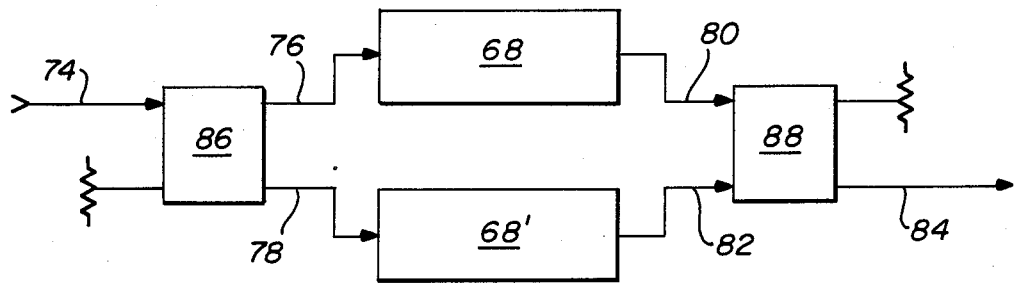
FIG. 4 is a schematic representation of a quadrature power combining circuit utilizing two of the hybrid-balun, power splitter/combiners of FIG. 3 connected in parallel to a first quadrature combiner for receiving an input signal and generating output signals which ar coupled to a second quadrature combiner to generate the amplified output unbalanced RF signal.

If still further power amplification is required, the hybrid-balun, power splitter/combiner 68 shown in FIG. 3 can be utilized in FIG. 4 with quadrature hybrids. The splitter/combiners are designated 68 and 68' in FIG. 4. A first quadrature splitter 86 accepts the unbalanced input signal on line 74 and splits it into two unbalanced output signals 76 and 78 which differ in phase by 90°. Each of the hybrid-balun, power splitter/combiners 68 and 68' amplify those signals as previously discussed with respect to FIG. 3 and generate an amplified unbalanced output signal on lines 80 and 82. These signals are coupled to a quadrature combiner 88 which provides an unbalanced output signal with respect to ground on line 84.

Thus, the present invention discloses a hybrid-balun which is an in-phase hybrid and a balun in a single stage and which uses a transmission line such as coaxial cable. The length, L, of the coaxial cable as shown in FIG. 2 should be approximately equal to $\lambda/4$ where $\lambda =$ the wave length at the center frequency of the passband. Although the length $\lambda/4$ is a preferred length, it can also be greater than or less than $\lambda/4$ to facilitate impedance matching.

While the invention has been described in connection with a preferred embodiment, it is not intended to limit the scope of the invention to the particular form set forth, but, on the contrary, it is intended to cover such alternatives, modifications, and equivalence as may be included within the spirit and scope of the invention as defined in the appended claims.

I claim:

1. An in-phase hybrid-balun for splitting received unbalanced RF input power into first and second balanced RF output signals and providing an unbalanced-to-balanced impedance transformation comprising:

first and second transmission line baluns for receiving an unbalanced RF input signal and generating first and second balanced RF output signals, each balun having a predetermined characteristic impedance value to provide unbalanced-to-balanced impedance transformation between a signal input port at one end for receiving the unbalanced RF signal and an output port at the other end for providing a balanced RF signal output;

means for connecting the input ports of the first and second baluns in parallel to split the input unbalanced RF power into first and second balanced RF output signals; and signal isolation means interconnecting the output ports of the first and second baluns to isolate said output ports from each other as an in-phase hybrid-balun, said isolation means including a first isolation resistor connecting a first conductor of each balun at the port end; and a second isolation resistor connecting a second conductor of each balun at the output port end.

2. A hybrid-balun as in claim 1 wherein each of said baluns has a length of approximately $\lambda/4$ where $\lambda =$ the wave length at the center frequency of the passband.

3. A hybrid-balun as in claim 1 wherein each of said baluns has a length of greater than or less than $\lambda/4$ to act as an impedance transformer where $\lambda =$ the wave length at the center frequency of the passband.

4. An in-phase hybrid-balun for combining received first and second balanced RF input signals into a single unbalanced RF output signal and providing a balanced-to-un-balanced impedance transformation comprising:

first and second transmission line baluns for receiving corresponding first and second balanced RF signal inputs and generating a combined unbalanced RF output signal, each having a predetermined characteristic impedance value to provide balanced-to-unbalanced impedance transformation between a signal input port at one end for receiving one of the balanced RF input signals and an RF signal output port at the other end for providing the unbalanced RF output signal;

signal isolation means for connecting the input ports of said baluns to isolate the input ports from each other said isolation means including a first isolation resistor connecting a first conductor of the baluns at the port end; and a second isolation resistor connecting a second conductor of the baluns at the input port end; and means for interconnecting the output ports of said baluns in parallel to combine the first and second RF output signals into an unbalanced RF output signal as an in-phase hybrid-balun.

5. A hybrid-balun as in claim 4 where in each of said baluns has a length of approximately $\lambda/4$ where $\lambda=$ the wave length at the center frequency of the passband.

6. A hybrid-balun as in claim 4 wherein each of said baluns has a length of greater than or less than $\lambda/4$ to act as an impedance transformer where $\lambda=$ the wave length at the canter frequency of the passband.

7. An in-phase hybrid-balun, power splitter/combiner comprising:

a first coaxial cable in-phase hybrid-balun having a predetermined characteristic impedance value to provide unbalanced-to-balanced impedance transformation, said first hybrid-balun receiving an unbalanced RF input signal at its input and generating first and second isolated, balanced RF output signals;

power amplifier means coupled to said first in-phase hybrid-balun for receiving and amplifying the isolated, balanced RF output signals; and a second coaxial cable in-phase hybrid-balun coupled to the output of said power amplifier means having a predetermined characteristic impedance value to provide balanced-to-unbalanced impedance transformation, said second hybrid-balun having first and second inputs for receiving the amplified balanced, isolated RF output signals and combining the amplified balanced signals to provide an amplified unbalanced RF output signal.

8. A hybrid-balun, power splitter/combiner as in claim 7 wherein said first in-phase coaxial cable hybrid-balun comprises:

first and second coaxial cable baluns for receiving an unbalanced RF input signal and generating first and second balanced RF output signals, each balun having a signal input port at one end including an inner conductor and a grounded outer conductor for receiving the unbalanced RF signal and an output port at the other end including an inner conductor and an outer conductor for providing a balanced RF signal output;

means for connecting the input ports of the first and second baluns in parallel to split the input unbalanced RF power into first and second balanced, RF output signals for coupling to the power amplifier means; and signal isolation means interconnecting the output ports of the first and second baluns to isolate said output ports from each other.

9. A hybrid-balun, power splitter/combiner as in claim 8 wherein said isolation means comprises:

a first isolation resistor connecting the outer conductors of each balun at the output port end; and a second isolation resistor connecting the inner conductors of each balun at the output port end.

10. A hybrid-balun, power splitter/combiner as in claim 9 wherein each of said first and second coaxial cable baluns has a length of approximately $\lambda/4$ where $\lambda=$ the wave length at the canter frequency of the passband.

11. A hybrid-balun, power splitter/combiner as in claim 9 wherein each of said first and second coaxial cable baluns has a length of greater than or less than $\lambda/4$ to facilitate impedance matching where $\lambda=$ the wave length at the center frequency of the passband.

12. A hybrid-balun, power splitter/combiner as in claim 7 wherein said second coaxial cable in-phase hybrid-balun comprises:

first and second coaxial cable baluns for receiving corresponding first and second balanced RF signal inputs from the output of the power amplifier means and generating an unbalanced RF output signal, each balun having a signal input port at one end including an inner conductor and an outer conductor for receiving one of the balanced RF input signals and an RF signal output port at the other end having an inner conductor and a grounded outer conductor for providing the unbalanced RF output signal;

signal isolation means for connecting the input ports of said first and second baluns to isolate the input ports from each other; and means for connecting the output ports of said first and second baluns in parallel to combine the first and second balanced Rf input signals from the power amplifier means into an unbalanced RF output signal.

13. A hybrid-balun, power splitter/combiner as in claim 12 wherein said signal isolation means for said second coaxial cable hybrid-balun comprises:

a first isolating resistor connecting the outer conductors of the first and second baluns at the input port end; and a second isolation resistor connecting the inner conductors of the first and second baluns at the input port end.

14. A hybrid-balun, power splitter/combiner as in claim 13 wherein each of said first and second coaxial cable baluns has a length of approximately $\lambda/4$ where $\lambda=$ the wave length at the center frequency of the passband.

15. A hybrid-balun, power splitter/combiner as in claim 13 where in each of said first and second coaxial cable baluns has a length of greater than or less than $\lambda/4$ to facilitate impedance matching where $\lambda=$ the wave length at the center frequency of the passband.

* * * * *

UNITED STATES PATENT AND TRADEMARK OFFICE
CERTIFICATE OF CORRECTION

PATENT NO. : 4,916,410

DATED : April 10, 1990

INVENTOR(S) : E. M. Littlefield

It is certified that error appears in the above-identified patent and that said Letters Patent is hereby corrected as shown below:

Column 2, line 66, change "ar" to "are".
Column 4, line 23, change "Point" to "point".
Column 4, line 28, change "Parallel" to "parallel".
Column 4, line 30, change second occurrence "10" to "10'".
Column 6, line 51, after "the" insert --output--.
Column 6, line 64, change "to-un-balanced" to "to-unbalanced".
Column 6, line 68, after "each" insert --balun--.
Column 7, line 11, after "the" insert --input--.
Column 7, line 25, change "canter" to "center".
Column 8, line 15, change "canter" to "center".
Column 8, line 41, change "Rf" to "RF".
Column 8, line 47, change "isolating" to "isolation".
Column 8, line 59, change "where in" to "wherein"

Signed and Sealed this

Twenty-third Day of July, 1991

*Attest:*

HARRY F. MANBECK, JR.

*Attesting Officer*  *Commissioner of Patents and Trademarks*